Figure 1:
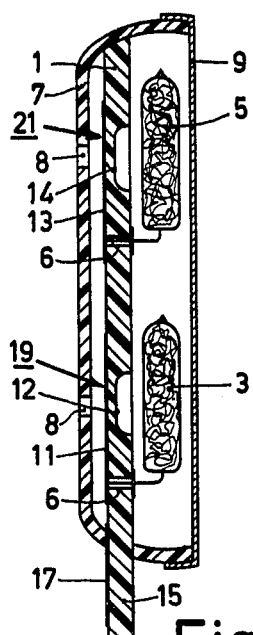

United States Patent [19]

van Werkhoven

[11] 4,154,569

[45] May 15, 1979

[54] FLASHLAMP UNIT

[75] Inventor: Jan van Werkhoven, Eindhoven, Netherlands

[73] Assignee: U.S. Philips Corporation, New York, N.Y.

[21] Appl. No.: 794,397

[22] Filed: May 6, 1977

[30] Foreign Application Priority Data

May 10, 1976 [NL] Netherlands .......................... 7604952
Jan. 10, 1977 [NL] Netherlands .......................... 7700161

[51] Int. Cl.² .............................................. F27D 1/08
[52] U.S. Cl. ........................................ 91/357; 362/15
[58] Field of Search .......................... 431/95 A, 95 R; 354/143, 148; 362/14, 15

[56] References Cited

U.S. PATENT DOCUMENTS

| 3,666,394 | 5/1972 | Bok et al. ............................. 431/95 R |
| 4,017,728 | 4/1977 | Audesse et al. ..................... 431/95 R |
| 4,040,777 | 8/1977 | Collins et al. ....................... 431/95 R |

*Primary Examiner*—Louis J. Casaregola
*Attorney, Agent, or Firm*—David R. Treacy; Robert S. Smith

[57] ABSTRACT

A flashlamp unit having a plurality of flashlamps secured to a support on which an electrical circuit is printed. The flashlamps are connected to the circuit which includes break switches. The support with the electrical circuit and break switches has such a construction that the electrical conductors of the break switches and the circuit can be provided in the same operational step.

3 Claims, 6 Drawing Figures

FLASHLAMP UNIT

The invention relates to a flashlamp unit having at least two flashlamps which are secured to a support plate on which an electrical circuit is printed with which the flashlamps are connected and in which break switches are incorporated which are each positioned opposite to a flashlamp which activates the break switch by the thermal energy radiated from flashing the lamp. Such a flashlamp unit is commercially available under the registered trademark "Topflash" and is described in the non-prepublished Netherlands Patent Application 7,507,857.

In the commercially available flashlamp unit, the support plate has an aperture, opposite to each flashlamp, over which a conductive foil of a low-melting-point metal, for example tin, is provided which is soldered to a track of the printed circuit on either side of the aperture. The foil serves as a break switch to prepare a subsequent flashlamp for ignition after the flashlamp opposite to the foil has been flashed. The foil fuses under the influence of the thermal energy of the flashlamp so that an initial shortcircuit across a part of the circuit is removed.

In the said through-connecting flashlamp unit the break switches have to be positioned accurately on the tracks of the printed electrical circuit in which advanced soldering methods are used for the connection. In the soldering process it is particularly important that the zones of the foil adjoining the soldering place fuse and that the foil breaks.

It is the object of the invention to provide a flashlamp unit of the kind mentioned in the preamble of which the support with the electrical circuit and break switches has such a design that this component can be manufactured in a more simple, rapid and economically attractive manner and a particular object of the invention is to provide such a construction of this component that the electrical conductors of the break switches and the circuit can be provided in one operational step.

For that purpose the flashlamp unit according to the invention is characterized in that each break switch consists of a portion of the support plate having a reduced thickness and an electrically conductive track of the circuit provided thereon.

In the flashlamp unit, the electrical circuit in which the break switches are incorporated is preferably situated on a flat surface of the support plate. The other side of the plate is locally provided with a cavity at the area of the flashlamp, so that the support has a region of a smaller thickness opposite to each flashlamp. The support may be disposed in facing relationship to the flashlamps either with its flat surface and with its opposite side. The former possibility is to be preferred so as to minimize the distance from the break switch to the flashlamp. The electrical circuit may be provided by means of silk-screening, transfer printing or another printing technique on the flat surface of the support, the tracks which have to be interrupted upon flashing a flashlamp so as to prepare a subsequent flashlamp for flashing, being laid over a region of the support having a smaller thickness.

Each break switch thus consists of a portions having a support plate of reduced thickness situated opposite to a flashlamp and a conductive track which is part of the circuit cooperating with the portion of the support plate. Upon flashing the flashlamp arranged opposite to the break switch the switch is destroyed in that the material of the support plate in the reduced thickness region withers, shrinks or melts away as a result of the thermal energy of the lamp with the simultaneous interruption of the electrically conductive track.

A support plate of a thermoplastic synthetic resin, for example polystyrene, polyvinylchloride, polymethacrylate or polycarbonate, is preferably used. In order to improve the heat absorbing capacity of the switch, the synthetic resin may be pigmented. A white pigment may be used, for example chalk, talcum or titanium oxide, or a coloured pigment may be used, for example soot. In addition (soluble) dyes may be used. For reasons of rigidity the support generally has a thickness of 0.5 to 2 mm, typically 1 mm. At the area of the break switches the thickness is preferably from 10 to 300 microns. The electrical circuit may be formed from a metal, for example, silver, nickel, tin, copper or other readily conducting material, for example graphite.

The support plate may be manufactured by means of a mould contoured for creating the reduced-thickness-portions in the support plate. The distance intermediate the oppositely located walls of the mould determine the thickness of the support at the area of the break switches. Such a mould may also be used in a method in which a synthetic resin film is used. The film is positioned between the oppositely located walls of the mould, after which the mould is filled with synthetic resin.

A preferred embodiment of the flashlamp unit is characterized in that the portion of reduced thickness has a slot crossing the track.

An advantage of this embodiment is that when the flashlamp is fired the support material is deformed in a very short time and already with comparatively little thermal energy in such manner that the slot aperture is enlarged and the track is destroyed.

The width of the slot in the break switches depends on the method to be used with which the conductive track is provided on the support, and on the properties —such as the viscosity—of the material from which the track is formed. In general, the slot width will not exceed a few tenths of a millimeter, for example, 0.2 mm.

Another preferred embodiment of the flashlamp unit in accordance with the invention is characterized in that the slot has a widening on either side of the track. The parts to be destroyed of the break switch are thus separated for the greater part from the surrounding material. The advantage of this is that upon firing the flashlamp situated opposite to the break switch, the deformation of the switch is not impeded by adjoining material which is not sufficiently heated. Also, the supplied thermal energy is hardly dissipated, so that the break switch reacts very rapidly and to a smaller amount of thermal energy.

Again another embodiment of the flashamp unit is characterized in that the support plate has two layers one of which comprises the break switches and the other of which is apertured at the area of said switches.

An advantage of this embodiment is that the starting material in the manufacture of the support may be a film having a thickness equal to the required reduced thickness of the support at the area of the break switches, after which the layer is combined with the perforated layer. The layers may be connected together over their entire abutting surface, as is the case when the support plate is formed in a mould while using film as described above, or they may be connected only locally.

A certain embodiment of the flashlamp unit is characterized in that, at the places of reduced thickness, the support has at least one aperture on either side of the track.

An advantage of this embodiment is that the perforated break switches react more rapidly to the thermal radiation emitted by the flashlamps. In units in which the break switches can be reached by a pointed object, this embodiment has the extra advantage that the break switches can easily be interrupted manually. The manual interruption of the switch is necessary, for example, when it is desired to flash two or more flashlamps at a time. The invention also relates to a support for a flashlamp unit according to the invention.

Figure 2:
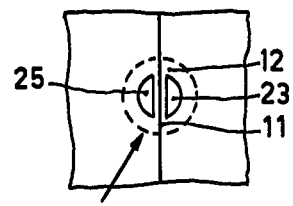
Figure 3:
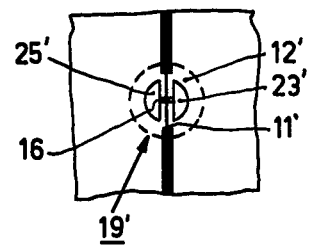
Figure 4:
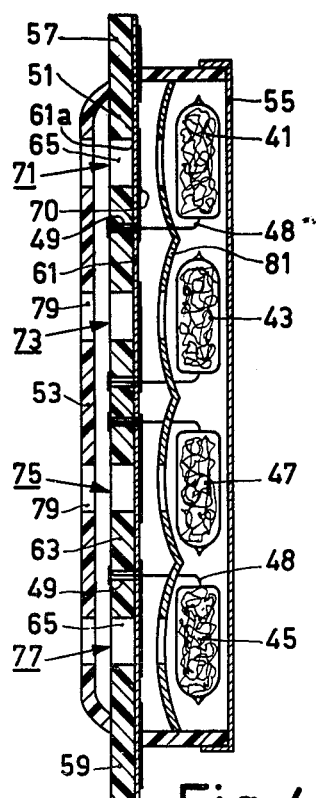
Figure 5:
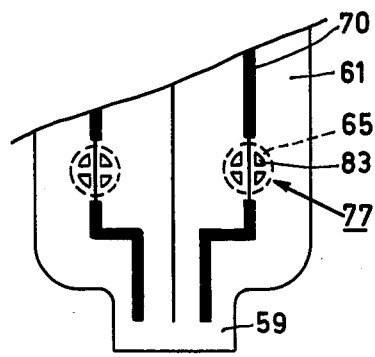
Figure 6:
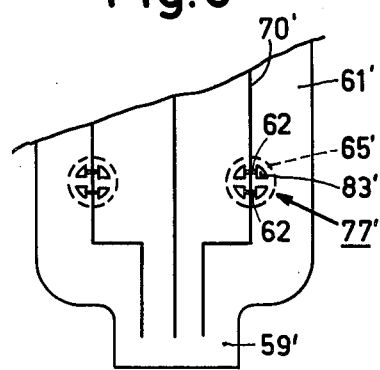

Embodiments of the invention will now be described in greater detail, by way of example, with reference to the accompanying drawing, in which FIG. 1 is a longitudinal sectional view of a first embodiment of the flashlamp unit according to the invention, FIG. 2 is a rear view of a part of the support plate of the flashlamp unit shown in FIG. 1, comprising a break switch, FIG. 3 shows a modified embodiment of the break switch shown in FIG. 2, FIG. 4 is a longitudinal sectional view of a second embodiment of the flashlamp unit in accordance with the invention, and FIG. 5 is a front elevation of a part of the support plate of the flashlamp unit shown in FIG. 4, comprising a break switch, and FIG. 6 shows a modified embodiment of the break switch shown in FIG. 5.

The flashlamp unit shown in FIG. 1 has a support plate 1 of polyvinyl chloride on which an electric circuit is printed. The support plate has a thickness of approximately 1.5 mm. Reference numerals 3 and 5 denote combustion flashlamps which are secured to the support plate 1. The flashlamps are connected mechanically to the support and connected electrically to the electrical circuit by metal lead-throughs 6. A housing of synthetic resin is closed on the lamp side by a transparent cover 9.

The flashlamp unit has a connection member 15 with which the unit can be placed on a photocamera. Present on the connection members is a supply conductor 17 which is connected to the electrical circuit of which only the nickel tracks 11 and 13 are shown. The tracks 11 and 13 are situated on the side of the support plate remote from the lamps. Opposite to the flashlamp 3 the support has a break switch 19 which consists of a reduced thickness portion 12 of the support plate and the portion of track 11 provided thereon. Opposite to the flashlamp 5 the support has a break switch 21 consisting of a reduced thickness portion of the support plate and the portion of track 13 provided thereon. The reduced thickness of the support at the area of the break switches is 200 microns. Upon flashing a lamp, for example lamp 3, light is irradiated to the exterior via the transparent covers. In addition, the oppositely located break switch 19 is activated by the thermal energy of the lamp. The material of the support at the area of the break switch shrinks away while simultaneously interrupting the track 11. The track 11 initially formed a shortcircuit for the flashlamp 5. Due to the interruption of the track the shortcircuit is removed and flashlamp 5 may then be flashed. If desired, a reflector is present between the flashlamps 3 and 5 and the support 1. Said reflector should have such apertures that each break switch can be radiated by the burning flashlamp arranged opposite to the switch.

The housing 7 of synthetic resin comprises, opposite to the break switches, apertures 8 through which the break switches are visible. Since each break switch is destroyed when the lamp situated opposite to the switch is fired, the break switch also forms an indication as to the fact whether a given lamp has or has not been fired. In order to increase the contrast, a dye has been added to the material of the track, in this case green.

FIG. 2 shows a part of the support plate 1 of the flashlamp unit shown in FIG. 1. Visible is the break switch 19 which consists of the area of the support of smaller thickness 12 and the track 11 provided thereon. Region 12 is weakened by apertures 23 and 25 which are situated on either side of the track 11.

FIG. 3 shows a modified embodiment of the break switch 19. In this break switch 19' the place of reduced thickness has a slot 16 which is situated between the apertures 23' and 25' and adjoins same. The width of the slot 16 is 0.2 mm. The track 11' narrowed at the area of the break switch is provided across the slot 16. When the lamp situated opposite to the break switch 19' is fired, the support material will shrink or wither away at the area of the break switch, so that the slot aperture is enlarged and simultaneously the track 11' is interrupted.

The flashlamp unit shown in FIG. 4 has a first and a second group of high-voltage flashlamps. 41 and 43 denote flashlamps of the first group, 45 and 47 denote flashlamps of the second group. Terminals 48 of the flashlamps are connected to a support plate 51 by means of respective leadthroughs 49. The support plate 51 is enclosed in an opaque housing 53 of synthetic resin which is closed with a transparent cap 55 overlying the flashlamps. The support plate 51 has two connection members 57 and 59 which can be arranged in a fitting aperture of a photocamera. The electrical circuit printed on the support plate is such that the first group of flashlamps can be flashed when the flashlamp unit is coupled to a camera by means of the connection member 59. After flashing the flashlamps of the first group, the flashlamp unit is inverted and placed on the camera with the connection member 57, after which the flashlamps of the second group can be flashed. As a result of this, the angle between the axis of the lens of the camera and that of the light ray of the lamp is not too close to zero degrees. This serves to avoid the "red eye" effect.

In this embodiment the support consists of two layers 61 and 63. Layer 61 consists of polystyrene and has a thickness of 20 microns. The side of the layer 61 facing the flashlamps is provided with a part of the printed electrical circuit. Another part is situated on the layer 63, which also consists of synthetic resin and has apertures 65 adjacent the flashlamps. The two layers are locally connected together by means of the leadthroughs 49 with which the lamp terminals 48 are connected. Opposite to each of flashlamps 41, 43, 45 and 47 are situated respective break switches 71, 73, 75 and 77, respectively. The break switch 71, which can be radiated by flashlamp 41, consists of a portion 61a of layer 61 present at the area of the aperture 65 with the electrically-conductive silver track 70 of the electrical circuit provided thereon. The other break switches are constructed in the same manner. The operation of the break switches 71, 73, 75 and 77 corresponds to the operation of the switches of the flashlamp unit shown in FIG. 1.

The housing 53 of synthetic resin has apertures 79 at the level of the break switches, via which apertures the switches can be interrupted manually by means of a sharp object. The break switches are also visible through the holes 79, so that the break switches serve as indicators for the fired or non-fired state of the flashlamps arranged at the level of the break switches.

The flashlamp unit further comprises a reflector member 81 arranged between the support plate and the flashlamps. At the area of the flashlamps the reflector body 81 has slot-shaped holes (not shown) through which the lamp poles extend. The holes furthermore serve for keeping free the break switches so that a flashing flashlamp can radiate the switch present opposite to the lamp.

FIG. 5 shows a part of the support plate 51 of the flashlamp unit shown in FIG. 4. Visible is a part of the surface of the layer 61 having the electrical circuit, as well as the break switch 77. At the area of aperture 65 the layer 61 is weakened by holes 83. The layer 61 is weakened similarly near the other break switches.

FIG. 6 shows a modified embodiment of the break switch 77. Said break switch 77' has two slots 62 across which the track 70' is passed. The slots 62 have a width of 0.1 mm and have widenings 83' on either side of the track 70'.

What is claimed is:

1. A flashlamp unit which comprises:
   a support plate having at least one reduced thickness portion,
   at least two flashlamps carried on one side of said support plate,
   an electrical circuit printed on said support plate which includes an elongated conductive track and at least one break switch, each break switch including a portion of said elongated conductive track disposed on said support plate, said support plate directly under said track being imperforate, said support plate being of reduced thickness relative to the remainder of said support plate directly under each of said break switches, said flashlamps being connected to said electrical circuit and at least one flashlamp being disposed proximate to one of said break switches, each of said break switches opening responsive to thermal energy radiated upon flashing of the lamp proximate thereto.

2. A flashlamp unit as claimed in claim 1 wherein said reduced thickness portions of said support plate have at least one aperture on at least one side of said track.

3. A flashlamp unit as claimed in claim 1 wherein said support plate has two layers, one of said layers comprising said break switch and the other of which is perforated at the area of said switch.

* * * * *